United States Patent [19]

Takagi et al.

[11] 4,279,772

[45] Jul. 21, 1981

[54] CRYSTAL FOR SCINTILLATOR

[75] Inventors: Kazumasa Takagi, Kokubunji; Tokuumi Fukazawa, Tachikawa; Tetsu Oi, Tokyo, all of Japan

[73] Assignee: Hitachi Chemical Company, Ltd., Tokyo, Japan

[21] Appl. No.: 112,276

[22] Filed: Jan. 15, 1980

[30] Foreign Application Priority Data

Jan. 17, 1979 [JP] Japan .................................. 54/2968

[51] Int. Cl.$^3$ ............................................. C09K 11/46
[52] U.S. Cl. ............................. 252/301.4 F; 250/483
[58] Field of Search ................. 252/301.4 F; 423/326, 423/593; 250/483

[56] References Cited

U.S. PATENT DOCUMENTS 4,187,139   2/1980   Brice et al. ...................... 423/326 X

FOREIGN PATENT DOCUMENTS 2902517   7/1979   Fed. Rep. of Germany ........... 423/326
2390401   1/1979   France ..................................... 423/593

OTHER PUBLICATIONS

Blanzat et al. "Phys. Stat. Sol. B", 76, pp. K5–K8, 1976.
Tada "Chem Abstracts", 85, 185141t, 1976.

Primary Examiner—Jack Cooper
Attorney, Agent, or Firm—Craig and Antonelli

[57] ABSTRACT

A crystal for a scintillator is a single crystal of $Bi_4Ge_3O_{12}$ containing up to 0.5% by weight of $Bi_4Si_3O_{12}$ and/or up to 50 ppm of Gd. The light output of this crystal as a scintillator can be increased by about 20% as compared with the light output of the conventional crystal of additive-free $Bi_4Ge_3O_{12}$.

4 Claims, 2 Drawing Figures

CRYSTAL FOR SCINTILLATOR

BACKGROUND OF THE INVENTION

1. Field of the Invention

The present invention relates to a crystal for an X-ray or γ-ray scintillator. More particularly, the invention relates to a crystal for a scintillator having a short decay time and a high sensitivity.

2. Brief Description of the Prior Art

A single crystal of bismuth germanate ($Bi_4Ge_3O_{12}$, hereinafter referred to as "BGO") heretofore used as a crystal for an X-ray or γ-ray scintillator are characterized in that (i) since the atomic numbers of the constituent elements are large and the density of the crystal is high, the absorption coefficient to radiations is high, (ii) the decay time is very short (the time necessary for attenuation to 0.1% is 30 milliseconds) and (iii) the crystal is nonhygroscopic. Because of these merits, this single crystal is used as a scintillator crystal for X-ray CT (computed Tomography) and a medical instrument such as a positron camera, though the sensitivity is relatively low. NaI or thallium (Tl)-incorporated NaI, which has been used for the above-mentioned object, has a sensitivity about 10 times as high as that of the crystal of BGO, but the decay time is very long (the time necessary for attenuation to 0.1% is 350 milliseconds). Accordingly, NaI or Tl-incorporated NaI has a defect that the image becomes obscure. Accordingly, it has been desired to increase the sensitivity of BGO while not degrading the merit of a short decay time. The scintillation conversion efficiency (light output) of the conventional cyrstal of BGO is only 10% of that of NaI or the like, and in order to reduce doses of radiations applied to human bodies, development of a crystal of BGO having a high scintillation conversion efficiency has been desired.

The scintillation center of the crystal of BGO is the ion of Bi as the constituent element. According to the conventional technique, the zone-refined starting material is used for increasing the purity and removing impurity elements having bad influences and the scintillation conversion efficiency is thus improved. However, a long time is necessary for the zone refining of the starting material for attaining a desired high purity and the loss of the starting material is large. For example, the final yield is as low as about 35%.

The following references are cited to show the state of the art:

(1) M. J. Weber and R. R. Moncham; *Journal of Applied Physics*, vol. 44 (1973), pages 5495–5499;

(2) O. H. Nestor and C. Y. Huang; *IEEE Transactions on Nuclear Science*, vol. NS-22, February 1975, pages 68–71;

(3) Z. H. Cho and M. R. Farukhi; *Journal of Nuclear Medicine*, vol. 18 (1977), pages 840–844.

SUMMARY OF THE INVENTION

It is a primary object of the present invention to provide a crystal for a scintillator, which has a short decay time and a high sensitivity.

In accordance with the present invention, this object can be attained by a single crystal for a scintillator which comprises a crystal of $Bi_4Ge_3O_{12}$ containing one or both of $Bi_4Si_3O_{12}$ in an amount of not greater than 0.5% by weight and Gd in an amount of not greater than 50 ppm by weight.

If the content of $Bi_4Si_3O_{12}$ or Gd exceeds the above level, the sensitivity to radiations is reduced and becomes equal to or lower than the sensitivity of the conventional crystal of BGO. Even if the amount of $Bi_4Si_3O_{12}$ or Gd contained in the single crystal of BGO is very small, it exerts a corresponding effect and the sensitivity is increased. Therefore, the lower limit of the content may be very small.

Especially good results are obtained if the content of $Bi_4Si_3O_{12}$ in the crystal of BGO is 0.02 to 0.2% by weight, and optimum results are obtained when the content of $Bi_4Si_3O_{12}$ is 0.05 to 0.1% by weight. Especially good results can also be obtained when the amount of Gd contained in the crystal of BGO is 1 to 10 ppm (by weight; all of "ppm" are by weight hereinafter). Even if $Bi_4Si_3O_{12}$ and Gd are incorporated in combination, the effect of the present invention is not reduced, namely, the sensitivity of the crystal containing both of them is almost the same as the better sensitivity in the sensitivities of the crystals containing one of them and the other in amounts of their respective amounts.

Although the scintillation conversion efficiency is increased by increasing the purity of the crystal according to the conventional technique, the scintillation conversion efficiency is increased by incorporation of the $Bi_4Si_3O_{12}$ and/or Gd as impurities into the crystal of BGO according to the present invention.

As a result of our research it has been found that the scintillation conversion efficiency can be increased by the addition of one or both of $Bi_4Si_3O_{12}$ and Gd, and the present invention has been completed based on this novel finding.

Although $Bi_4Si_3O_{12}$ has the same crystal structure as that of BGO, the scintillation conversion efficiency of $Bi_4Si_3O_{12}$ is low at room temperature and it is not useful as a scintillator crystal. However, if $Bi_4Si_3O_{12}$ is incorporated in BGO to form a solid solution, the light output of the solid solution under radiations is higher than that of a crystal of pure BGO.

DETAILED DESCRIPTION OF THE PRESENTLY PREFERRED EMBODIMENTS

The present invention will now be described in detail with reference to the following Examples.

EXAMPLE 1

This example illustrates a BGO crystal containing $Bi_4Si_3O_{12}$.

A mixture containing $Bi_4Ge_3O_{12}$, $Bi_2O_3$ and $SiO_2$ in amounts determined according to the intended composition was used as the starting material, and a single crystal of BGO containing $Bi_4Si_3O_{12}$ was grown by using a single crystal of BGO as a seed crystal according to the known Czochralski method. The starting BGO used was one that had been subjected to the zone refining one time. $Bi_4Si_3O_{12}$ formed a solid solution together with BGO. Various crystals were prepared by changing the content of $Bi_4Si_3O_{12}$ in the range of up to 5% by weight. For comparison, a single crystal of BGO free of $Bi_4Si_3O_{12}$ was grown under the same conditions.

Each of the obtained BGO single crystals was cut out in a size of a length of 20 mm, a width of 10 mm and a thickness of 2 mm to form a scintillator. The scintillator was exposed to γ-rays from a source of a radioactive isotope, $^{57}Co$. From the $^{57}Co$ spectrum determined by using a photomulitplier tube, the peak channel number was calculated as a value indicating the light output.

Figure 1:
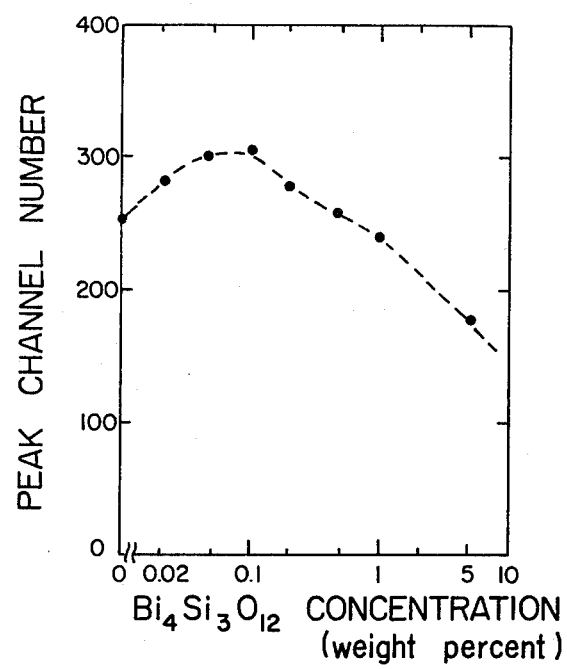
FIG. 1 is a graph showing the relation between the content of $Bi_4Si_3O_{12}$ in a single crystal of BGO and the light output expressed in terms of the peak channel number.

Obtained results are shown in FIG. 1. In FIG. 1 the ordinate indicates the peak channel number (ch) and the abscissa indicates the content (% by weight) of $Bi_4Si_3O_{12}$. As will be apparent from this Figure, the light output, that is, the peak channel number, depends on the concentration of $Bi_4Si_3O_{12}$ in the single crystal of BGO and the maximum value is obtained when the concentration of $Bi_4Si_3O_{12}$ is 0.05 to 0.1% by weight. In order to obtain a single crystal having a sensitivity higher than that of a single crystal of BGO free of $Bi_4Si_3O_{12}$, it is necessary that the amount of $Bi_4Si_3O_{12}$ should be up to 0.5% by weight, and better results are obtained when the content of $Bi_4Si_3O_{12}$ is 0.02 to 0.2% by weight. By incorporation of $Bi_4Si_3O_{12}$ into a single crystal of BGO, the light output is increased by about 20% at the highest increase.

BGO which had been subjected to the zone refining 2 times was used as the starting material and a crystal of BGO free of $Bi_4Si_3O_{12}$ was grown by the Czochralski method. The peak channel number of the resulting single crystal was 300. Accordingly, it is seen that incorporation of an appropriate amount of $Bi_4Si_3O_{12}$ is equivalent to increase of the number of the frequency of zone refining by one. In other words, the frequency of the zone refining of the starting material can be reduced by one time. If the frequency of the zone refining is reduced by one time, the time necessary for the manufacture can be shortened, and the loss of the starting material by the zone refining can be decreased and the final yield of BGO is remarkably improved. Since about 30% of the starting material is lost by conducting the zone refining one time, addition of an appropriate amount of $Bi_4Si_3O_{12}$ prevents this loss of the starting material.

A single crystal of BGO containing up to 1% by weight of $Bi_4Si_3O_{12}$ had an energy resolution of about 30%, which is comparable to that of BGO free of $Bi_4Si_3O_{12}$.

EXAMPLE 2

This example illustrates a BGO crystal containing Gd.

A single crystal of BGO was grown in the same manner as described in Example 1 except that $Gd_2O_3$ was used as the starting material of the additive. Various crystals were prepared by changing the content of Gd in a range of up to 100 ppm. For comparison, a single crystal of BGO free of Gd was grown under the same conditions.

The light outputs of the obtained crystals were determined in the same manner as described in Example 1.

Figure 2:
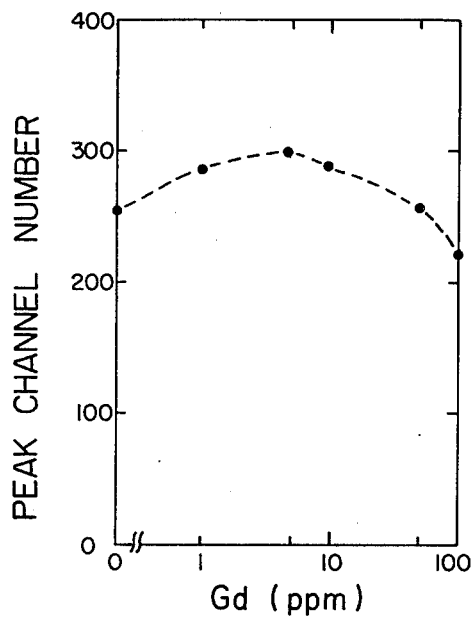
FIG. 2 is a graph showing the relation between the content of Gd in a single crystal of BGO and the light output expressed in terms of the peak channel number.

Obtained results are shown in FIG. 2. In FIG. 2, the ordinate indicates the peak channel number (ch) and the abscissa indicates the Gd content (ppm). As will readily be understood from the results shown in this figure, the light output, that is, the peak channel number, depends on the concentration of Gd in the single crystal of BGO. When the Gd concentration was up to 50 ppm, the sensitivity was higher than that of the crystal of BGO free of Gd, and when the concentration of Gd was 1 to 10 ppm, the peak channel number was further increased. By incorporation of Gd, the light output was increased by about 20% at the highest increase.

As is seen from the foregoing results, if Gd is incorporated into BGO, the light output BGO is increased. However, since the segregation coefficient of Gd to BGO is lower than 0.1, if it is intended to incorporate Gd at a concentration higher than 100 ppm in the crystal, the Gd concentration in the melt is increased and voids are readily formed in the crystal. Since these voids attenuate the generated light, the light output is consequently lowered. In order to increase the light output without formation of voids, it is preferred that the amount of Gd be adjusted to up to 50 ppm.

The energy resolution of the single crystal of BGO containing 50 ppm of Gd was 25% and it was found that this crystal had a good energy resolution.

As in the case of Example 1, incorporation of an appropriate amount of Gd into BGO is equivalent to increase of the frequency of the zone refining by one time. Accordingly, by incorporation of an appropriate amount of Gd, the frequency of the zone refining of the starting BGO can be reduced by one time without reduction of the sensitivity of the single crystal of BGO. Accordingly, the time necessary for the manufacture can be shortened and the loss of the starting material by the zone refining can be reduced.

As will readily be understood from the results of the foregoing examples, by incorporation of up to 0.5% by weight of $Bi_4Si_3O_{12}$ or up to 50 ppm of Gd into a single crystal of BGO, the light output of the single crystal of BGO as the scintillator can be increased by about 20% at highest, and when the light output of this single crystal is maintained at the same level as that of a single crystal of additive-free BGO, the frequency of the zone refining of the starting BGO can be reduced by one time, and the time necessary for the manufacture can be shortened and the loss of the starting material can be reduced.

EXAMPLE 3

A single crystal of BGO containing 0.1% by weight of $Bi_4Si_3O_{12}$ and 50 ppm of Gd was grown in the same manner as described in Example 1 or 2 except that $Bi_2O_3$, $SiO_2$ and $Gd_2O_3$ were used as the raw materials of the additives. It was found that the peak channel number of this single crystal was about 300. Accordingly, it was confirmed that even if $Bi_4Si_3O_{12}$ and Gd are incorporated in combination in a crystal of BGO, the effect of the present invention is not reduced but the effect is comparable to that attained by incorporation of one of these additives.

What is claimed is:

1. A crystal for a scintillator which comprises a single crystal of $Bi_4Ge_3O_{12}$ containing at least one component selected from the group consisting of $Bi_4Si_3O_{12}$ in an amount of not greater than 0.5% by weight and Gd in an amount of not greater than 50 ppm said amount being sufficient to effect, upon excitation by gamma ray radiation, a greater light output than that effected by a single crystal of $Bi_4Ge_3O_{12}$ free of said component grown under the same conditions as the single crystal of $Bi_4Ge_3O_{12}$ containing said component.

2. A crystal for a scintillator as set forth in claim 1 which comprises a single crystal of $Bi_4Ge_3O_{12}$ containing 0.02 to 0.2% by weight of $Bi_4Si_3O_{12}$.

3. A crystal for a scintillator as set forth in claim 1 which comprises a single crystal of $Bi_4Ge_3O_{12}$ containing 0.05 to 0.1% by weight of $Bi_4Si_3O_{12}$.

4. A crystal for a scintillator as set forth in claim 1 which comprises a single crystal of $Bi_4Ge_3O_{12}$ containing 1 to 10 ppm of Gd.

* * * * *